(12) United States Patent
Yowakim et al.

(10) Patent No.: US 7,444,164 B2
(45) Date of Patent: Oct. 28, 2008

(54) SYSTEM AND METHOD FOR RADIOS USING COMMON EQUIPMENT PACKAGING

(75) Inventors: Fathy Milad Yowakim, Kirkland (CA); Costel Nicolae, Dollard-des-Ormeaux (CA); Kenneth Clayton, Chateauguay (CA)

(73) Assignee: Harris Stratex Networks, Inc., Morrisville, NC (US)

( * ) Notice: Subject to any disclaimer, the term of this patent is extended or adjusted under 35 U.S.C. 154(b) by 145 days.

(21) Appl. No.: 10/855,469

(22) Filed: May 28, 2004

(65) Prior Publication Data

US 2005/0277402 A1     Dec. 15, 2005

(51) Int. Cl.
*H04M 1/00*      (2006.01)
(52) U.S. Cl. ............ 455/550.1; 455/76; 455/553.1
(58) Field of Classification Search ........... 455/403, 455/63.3, 73, 81–88, 575.7–575, 90.1–90.3, 455/550.1, 76, 575.8, 128, 575.1
See application file for complete search history.

(56) References Cited

U.S. PATENT DOCUMENTS

| | | | |
|---|---|---|---|
| 5,809,115 A * | 9/1998 | Inkinen | 379/93.05 |
| 5,828,951 A * | 10/1998 | Suemitsu | 455/575.7 |
| 6,895,419 B1 * | 5/2005 | Cargin et al. | 708/131 |
| 2004/0120093 A1 * | 6/2004 | Holly | 361/143 |
| 2004/0203528 A1 * | 10/2004 | Ammar et al. | 455/90.3 |
| 2005/0094359 A1 * | 5/2005 | Lee et al. | 361/679 |

* cited by examiner

*Primary Examiner*—Duc Nguyen
*Assistant Examiner*—Dai A Phuong
(74) *Attorney, Agent, or Firm*—Sheppard, Mullin, Richter & Hampton LLP

(57) ABSTRACT

A wireless communication system operating in a predetermined frequency range comprising a plurality of radios each having an enclosure configured to accept a common equipment assembly comprising a transmitter module, a receiver module, a synthesizer module, and an interface/radio processing control ("IF/RPC") module. The IF/RPC module has connectors for operably connecting the transmitter, receiver, and synthesizer modules thereto where at least one of the modules is mechanically attached to a mounting plate. The size and shape of each of the modules and the size and shape of the mounting plate are each substantially independent of the frequency band of operation.

21 Claims, 4 Drawing Sheets

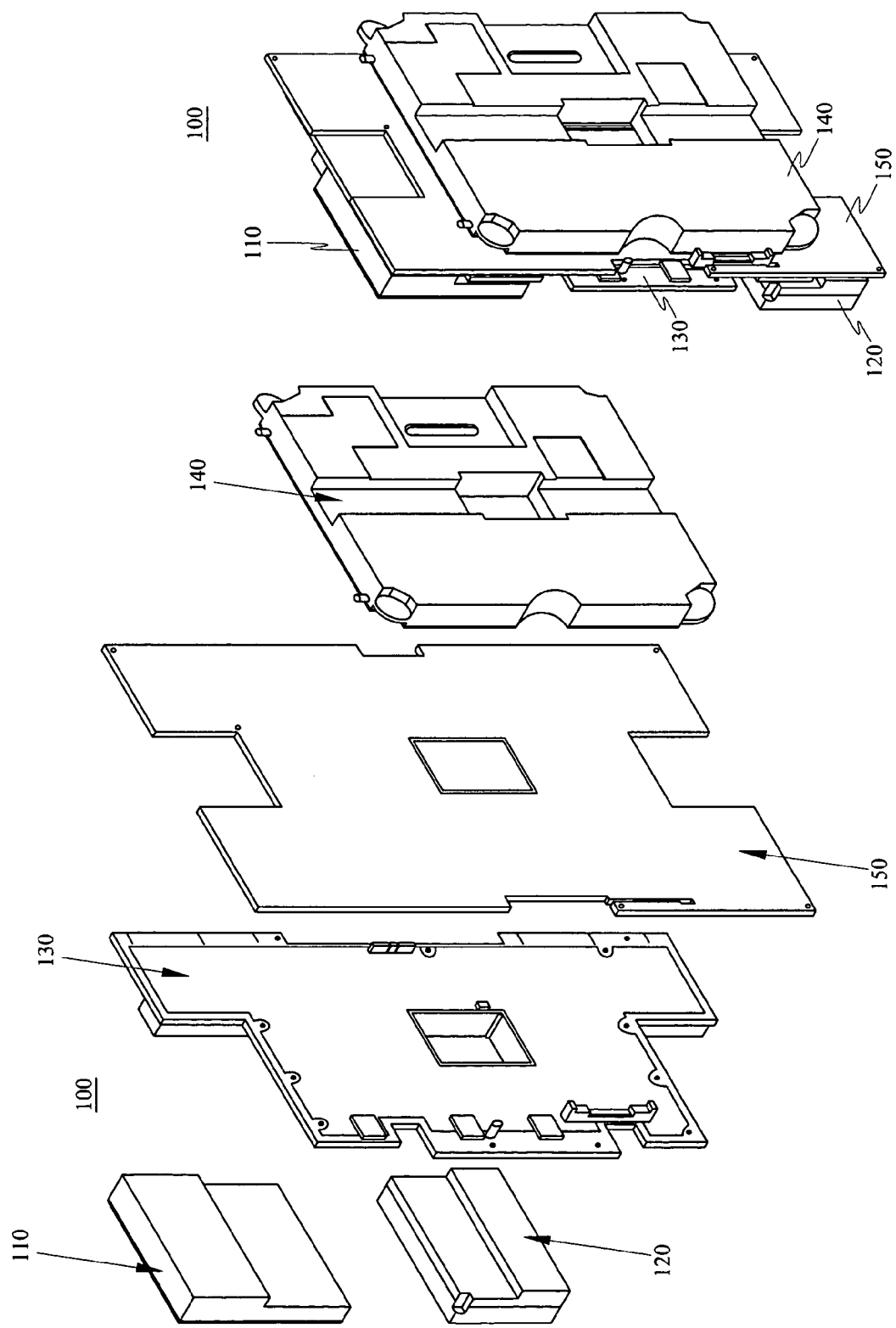

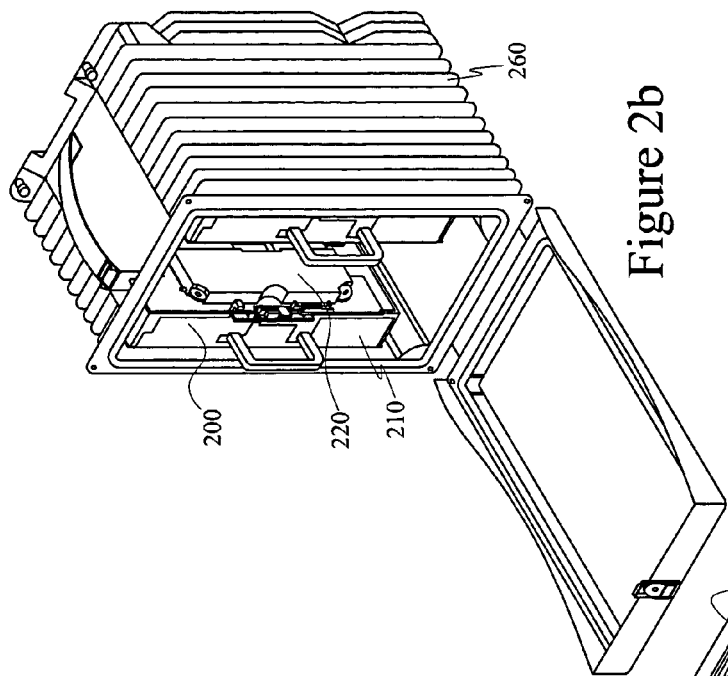
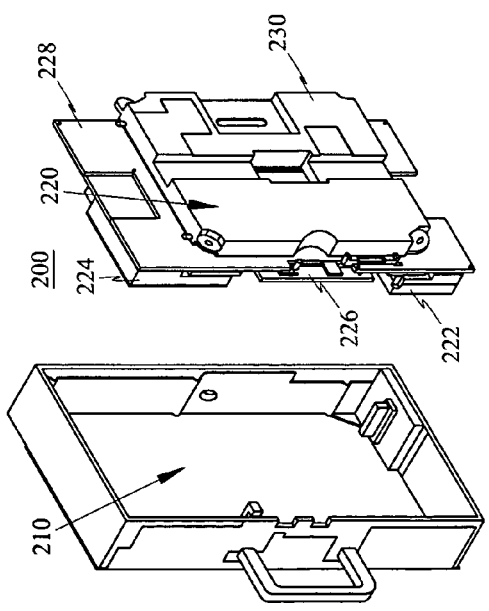
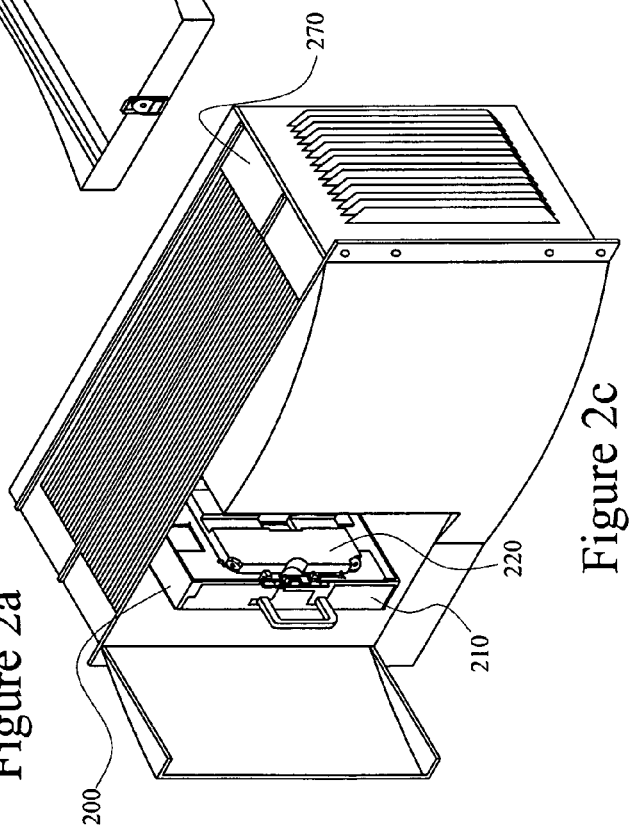
Figure 2a
Figure 2b
Figure 2c

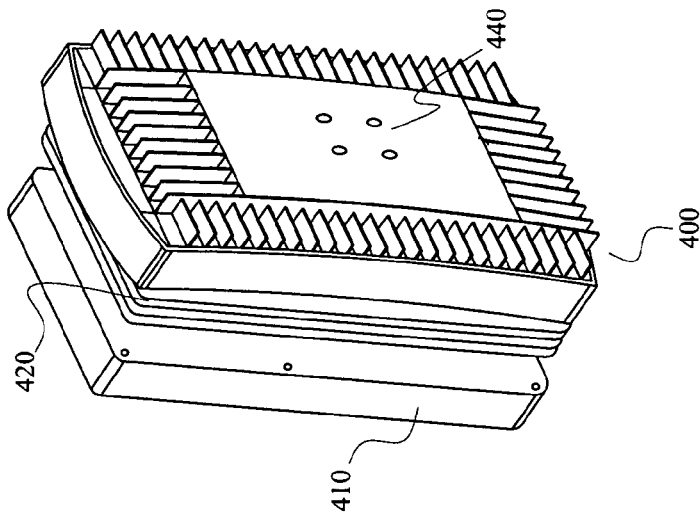
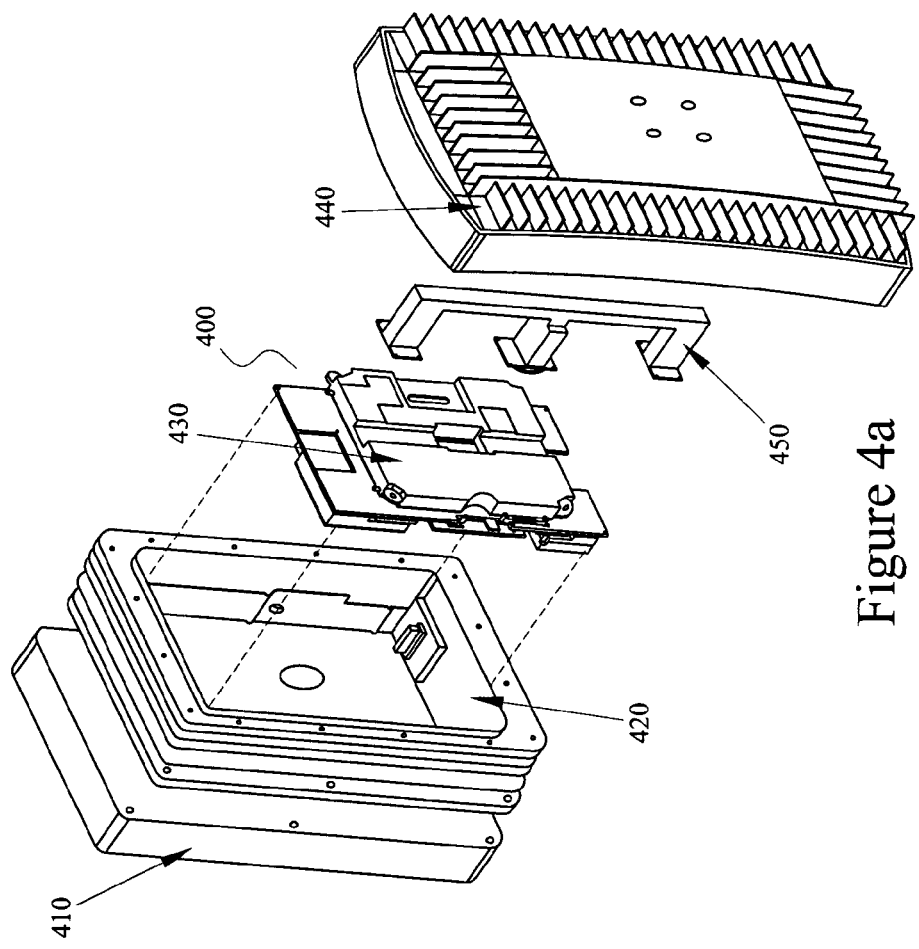

SYSTEM AND METHOD FOR RADIOS USING COMMON EQUIPMENT PACKAGING

BACKGROUND

Microwave and millimeter wave radio communications are widely used to transfer large amounts of data, such as in earth and space microwave long-distance communications links. They are also of interest for shorter-range, lower-power applications such as the basic voice, video, and data links between a cellular base station and a central telephone office. Such microwave communications systems are generally termed point-to-point systems.

Point-to-multipoint radio communication systems generally provide wireless access to communication networks. A typical point-to-multipoint system includes many base stations that are arranged over a service area. Base stations form the access points to the communication network. Each base station may include an antenna and a transceiver. The transceiver in the base station receives and transmits radio signals via the antenna to link multiple access points to the communication network. Generally, the antenna in the base station is typically a sector antenna.

With the proliferation of wireless telecommunications, there is an increased demand for high performance millimeter wave and microwave radio frequency ("RF") systems. These systems need to cover a large ranger of frequencies, to work as unprotected or protected systems, and to use different types of antenna and mounting configurations. Therefore, point-to-point and point-to-multipoint system physical packaging becomes increasingly important. Existing radio frequency units and antennas are bulky, heavy, visually obtrusive, and, in many cases, difficult to mount, change modules, shift operating frequencies and conduct operational or preventative maintenance. Further, with the proliferation of point-to-point and point-to-multipoint systems, new mounting space on existing masts and elsewhere has become more difficult to find thereby increasing the need for efficient packaging of RF transceivers. Because of this multitude of options, the radios, internal circuitry, and mechanical packaging in prior communications systems have different dimensions and correspond to specific applications.

SUMMARY

Clearly, there is a need in the art for an integrated point-to-point or point-to-multipoint radio frequency unit that is more compact and provides an ease of interchangeability. This novel concept of utilizing an integrated point-to-point or point-to-multipoint radio frequency unit allows for a versatility of transceiver main modules to be used in different types of radios and allows for an efficient installation of transceiver packages in different types of enclosures. Additionally, this concept improves cost reduction in manufacturing by increasing the quantity of common parts and allows a system to convert to another radio type by reuse of the same transceiver package.

It is therefore an object of the present disclosure to provide a novel wireless communication system operating in a predetermined frequency range comprising a plurality of radios each having a housing and a radio equipment assembly enclosure configured to accept a common radio equipment assembly comprising a transmitter module, a receiver module, a synthesizer module, and an interface/radio processing control ("IF/RPC") module. The IF/RPC module has connectors for operably connecting the transmitter, receiver, and synthesizer modules thereto where at least one of the modules is mechanically attached to a mounting plate. The size and shape of each of the modules and the size and shape of the mounting plate are each substantially independent of the frequency band of operation.

It is also an object of the present disclosure to provide a novel wireless communication system having plural nodes each having a radio transceiver and an antenna for communicating information between the nodes comprising a common radio equipment assembly and a housing configured to accept the common radio equipment assembly. The common radio equipment assembly comprises a transmitter module comprising circuitry for transmitting wireless signals in a predetermined frequency range, a receiver module for receiving wireless signals in the predetermined frequency range, a synthesizer module, an IF/RPC module having connectors for operably connecting the transmitter module, the receiver module, and the synthesizer module to the IF/RPC module, and a mounting plate to which at least one of the modules is mechanically mounted. The overall geometric dimensions of the individual modules and the common radio equipment assembly are substantially independent of the predetermined frequency range, which allows for swapping a radio equipment assembly operating at a first frequency with a radio equipment assembly operating at a second frequency and/or swapping one of the modules operating at a first frequency with a module operating at a second frequency.

It is a further object of the present disclosure to provide a novel wireless communication system having a plurality of radios each having an enclosure with frequency dependent dimensions and configured to accept an assembly having an IF/RPC module connected to a transmitter module, a receiver module, and a synthesizer module where the size and shape of each of the modules are substantially independent of the frequency band of operation.

It is also an object of the present disclosure to provide a novel frequency dependent radio operating in a predetermined frequency range having an enclosure configured to accept a mechanical interface adaptable to mount at least one of a plurality of operably connected radio frequency modules where both the mechanical interface and the plurality of radio frequency modules have a size and a shape substantially independent of an operating frequency range.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1a is an exploded pictorial view of an embodiment of the present disclosure showing a combination of modules into a radio equipment assembly.

FIG. 1b is a pictorial view of an embodiment of the present disclosure showing an assembled radio equipment assembly.

FIG. 2a is an exploded pictorial view of another embodiment of the present disclosure showing the combination of an enclosure and a radio equipment assembly.

FIG. 2b is a pictorial view of an embodiment of the present disclosure showing an equipment package mounted in a protected radio.

FIG. 2c is a pictorial view of an embodiment of the present disclosure showing an equipment package mounted in a high-power radio housing.

FIG. 4a is an exploded pictorial view of another embodiment of the present disclosure showing the combination of a radio equipment assembly, a radio enclosure and a flat antenna.

FIG. 4b is a pictorial view of an unprotected radio of the present disclosure affixed to a flat antenna.

DETAILED DESCRIPTION OF THE PREFERRED EMBODIMENTS

Figures 3A, 3B:
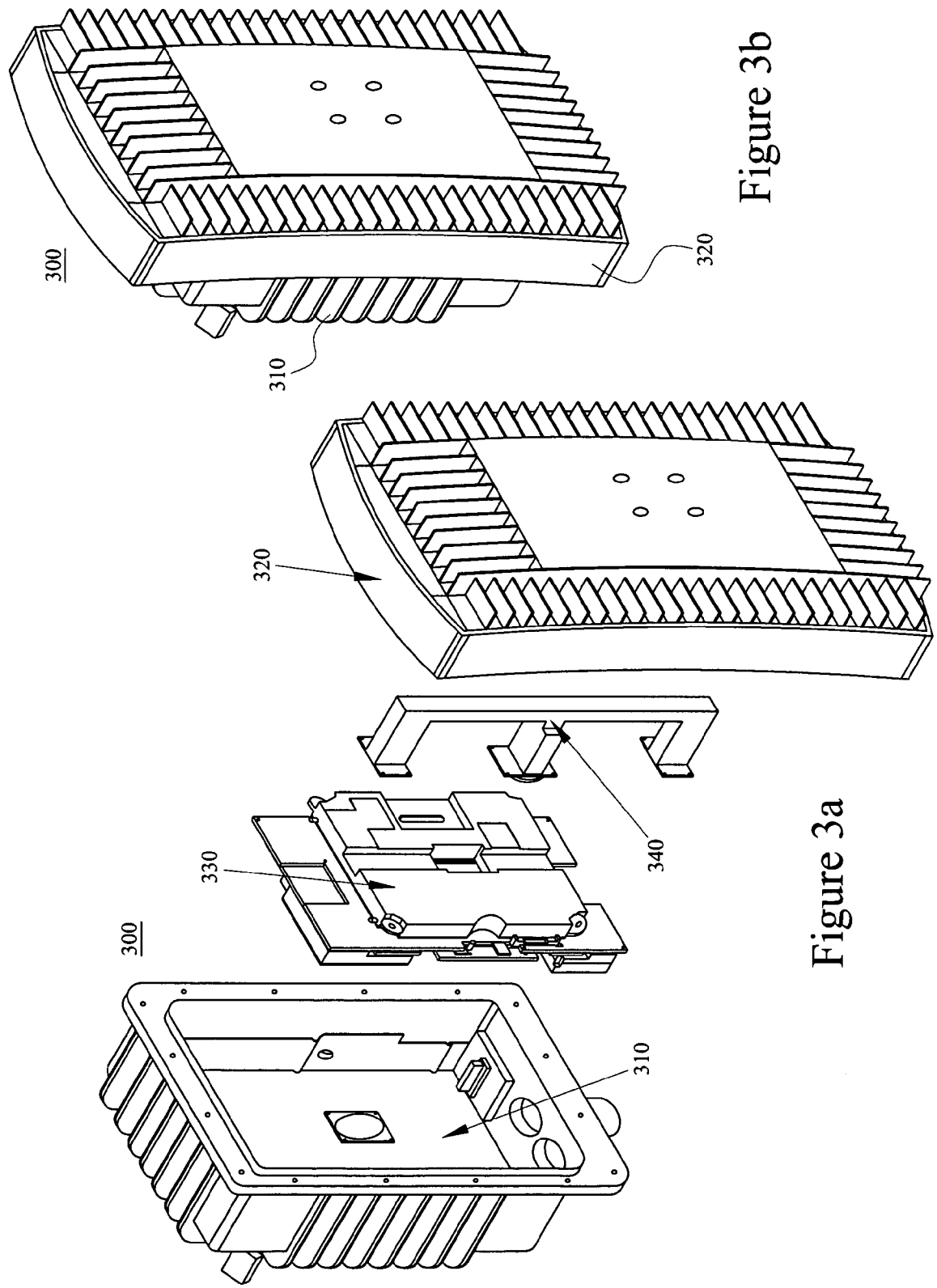
FIG. 3a is an exploded pictorial view of another embodiment of the present disclosure showing the combination of a radio equipment assembly and a radio enclosure.
FIG. 3b is a pictorial view of another embodiment of the present disclosure showing a radio equipment assembly enclosed in an unprotected radio.

FIG. 1a is an exploded pictorial view of an embodiment of the present disclosure showing a combination of modules into a radio equipment assembly 100. Referring to FIG. 1a, a radio equipment assembly 100 comprises a transmitter module 110, a receiver module 120, an interface/radio processing control ("IF/RPC") module 130, and a synthesizer module 140. The transmitter module 110 may be any known device that converts and encodes a stream of data into a desired form for transmission. The receiver module 120 may be any known device that receives a transmission signal and decodes the signal into a desired form. The transmitter module and the receiver module may also be integrated into a transceiver module (not shown) having the same functionality as both the transmitter and receiver modules. The synthesizer module 140 may be any known numerically-controlled or voltage-controlled synthesizer that produces a frequency output responsive to an electrical input. The IF/RPC module 130 may be any known device that meets a standard electrical interface with the transmitter module 110 and receiver module 120 and meets another standard electrical interface with the synthesizer module 140. The IF/RPC module 130 may serve as a shared boundary between the transmitter module 110, receiver module 120 and synthesizer module 140 where the electrical signals, connectors, timing, codes, and protocols that enable the modules to interact are defined. The IF/RPC module may be adaptable to allow the radio equipment assembly 100 to operate with multiple frequencies. The IF/RPC module 130 may have connectors (not shown) for operably connecting the transmitter module 110, receiver module 120 and synthesizer module 140 thereto. These connectors may be a plug-type that allows for ease of installation and replacement or may be permanent connectors or any other known type of connector in the art. In one embodiment, the radio equipment assembly further comprises a mounting plate 150 wherein at least one of the modules may be mechanically attached thereto. The mounting plate 150 can be devoid of electrical connections and can also act as a heat spreader thereby dispersing the generated heat of the attached modules. As will be apparent to those of skill in the art, the mounting plate may be integrated into one of the aforementioned modules and does not need to be a separate part.

Each of the modules may receive an input from a different source or may share a common input depending upon a desired configuration for a communication system. Further, each of the modules may transmit a different or common output depending upon a desired configuration for a communication system. Each of the modules has circuit components (not shown) that have dimensions dependent upon the frequency of operation. The dimensions of the transmitter module 110, receiver module 120, IF/RPC module 130, synthesizer module 140, and mounting plate 150 are substantially independent of the frequency of operation. The mounting plate 150 is common to all configurations of the modules, all operating frequencies and antenna connected thereto.

FIG. 1b is a pictorial view of an embodiment of the present disclosure showing an assembled radio equipment assembly 100. Referring to FIG. 1b, a radio equipment assembly 100 has similar elements as that represented in FIG. 1a. Therefore, similar elements will maintain like reference numbers. As shown, the transmitter module 110, receiver module 120, IF/RPC module 130, synthesizer module 140 and mounting plate 150 are combined to form the radio equipment assembly 100. The radio equipment assembly 100 may be used in point-to-point or point-to-multipoint wireless communication systems. The radio equipment assembly 100 may also be operated in the microwave or millimeter wave frequency range. Further, the radio equipment assembly 100 may be operably connected to a flat antenna or parabolic antenna (not shown). The radio equipment assembly 100 may be directly affixed to the antenna or may be affixed to a waveguide that is in radio frequency communication with the antenna. The radio equipment assembly 100 may be operated in an indoor or outdoor radio, in a protected or unprotected radio, in a standard or high power radio and in a known communication system having a frequency range of about 6 GHz to 38 GHz.

FIG. 2a is an exploded pictorial view of another embodiment of the present disclosure showing the combination of an enclosure 210 and a radio equipment assembly 220. Referring to FIG. 2a, an equipment package 200 comprises an radio equipment assembly enclosure 210 and a radio equipment assembly 220 having a transmitter module 224, a receiver module 222, an IF/RPC module 226, a mounting plate 228 and a synthesizer module 230. The radio equipment assembly enclosure 210 typically has exterior physical dimensions that are not a function of the operating frequency of the radio equipment assembly. This allows the dimensions of the radio equipment assembly enclosure to remain constant (i.e., the dimensions of the enclosure are "common") which accordingly allows the mechanical design of the radio housing (e.g., housing 260 or 270 in FIGS. 2b and 2c, respectively) to change in accordance with the needs of the communication system while only the receptacle of the radio housing 260 or 270 which accepts the radio equipment assembly enclosure 210 needing to remain the same. The physical dimensions of the radio equipment assembly 220 are common regardless of the mounting and system configurations, operating frequencies, and antennas attached thereto. In other words, the physical dimensions of the radio equipment assembly 220 are independent of operating frequency. For example, as shown in FIG. 2b, the equipment package 200 may be installed in a protected radio 260, and as shown in FIG. 2c the equipment package 200 may be installed in a high power radio housing 270. The embodiments shown in FIGS. 2b and 2c are illustrative only and are not meant to limit the scope of the invention. Rather, the scope of the invention is to be defined solely by the appended claims when accorded a full range of equivalence, many variations and modifications naturally occurring to those of skill in the art from a perusal hereof.

FIG. 3a is an exploded pictorial view of another embodiment of the present disclosure showing a combination of a radio equipment assembly 330 and a radio enclosure 310. Referring to FIG. 3a, an unprotected radio 300 comprises a radio enclosure 310, a radio equipment assembly 330, a diplexer 340 and a radio cover 320. The radio enclosure 310 may have different dimensions according to a communication system's frequency and configuration requirements. However, the radio equipment assembly 330 dimensions are common to all mounting and system configurations, operating frequencies, and antennas attached thereto. The diplexer 340 may be any common device that permits parallel feeding of one antenna from two transmitters at the same or different frequencies without the transmitters interfering with the other. Diplexers are commonly used in wireless communications systems to couple transmitters and receivers to the same antenna. FIG. 3b is a pictorial view of another embodiment of the present disclosure showing the radio equipment assembly 330 enclosed in an unprotected radio 300. The unprotected radio 300 may be operably connected to an antenna (not shown) wherein the antenna is in radio frequency communication with the radio equipment assembly 330. The unprotected radio 300 may be detachably affixed to the antenna. Further, the antenna may be a flat, parabolic, or other known antenna in the art. Depending upon the required mounting configuration, the unprotected radio 300 may be connected to a waveguide (not shown) which is in radio frequency communication with an antenna.

FIG. 4a is an exploded pictorial view of another embodiment of the present disclosure showing a combination of a radio equipment assembly 430, a radio enclosure 420 and a flat antenna 410. Referring to FIG. 4a, an unprotected radio 400 comprises a radio enclosure 420 and a radio cover 440 encasing a radio equipment assembly 430 and a diplexer 450. The radio enclosure 420 and radio cover 440 may have different dimensions according to a communication system's frequency and configuration requirements. However, the radio equipment assembly 430 dimensions are common to all mounting and system configurations, operating frequencies, and antennas attached thereto. The diplexer 450 may be any common device that permits parallel feeding of one antenna from one transmitter and one receiver or from two transmitters at the same or different frequencies without the transmitters interfering with the other. A flat antenna 410 is shown mechanically connected to the radio enclosure 420 and in radio frequency communication with the radio equipment assembly 430. The unprotected radio 400 may be directly affixed to the flat antenna 410 as shown, or other known antennas in the art such as a parabolic antenna. Depending upon the required mounting configuration, the unprotected radio may be connected to a waveguide (not shown) that is in radio frequency communication with an antenna. FIG. 4b is a pictorial view of the unprotected radio 400 of the present disclosure directly affixed to the flat antenna 410.

It shall be understood by those of skill in the art that in the aforementioned embodiments there exists a commonality in physical dimension of like parts regardless of the operating frequency of the communication system, the external configuration of the radio enclosures, the number of radios in the communication system, the antenna configuration, or the mounting configuration of the radios. For example, the radio equipment assembly 100 in FIGS. 1a and 1b, the radio equipment assembly 220 in FIGS. 2a, 2b, and 2c, the radio equipment assembly 330 in FIGS. 3a and 3b, and the radio equipment assembly 430 in FIG. 4a may be the same radio equipment assembly. Likewise, the modules that make up this same radio equipment assembly may also be the same in the aforementioned Figures. As one of skill in the art would readily understand, this type of commonality and interchangeability of parts is one of the key features of this disclosure.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What we claim is:

1. A wireless communication system, comprising:
a plurality of radios each having a radio equipment assembly and a radio equipment assembly enclosure configured with dimensions to accept the radio equipment assembly, the radio equipment assembly having opposed sides and a plurality of modules to facilitate communication with the radio equipment assembly of one of the remaining radios of the plurality of radios employing an operating frequency band, with the dimensions of the radio equipment assembly enclosure and a size and a shape of each of the plurality of modules being independent of the operating frequency band, with an aperture being disposed within the radio equipment assembly to facilitate wireless communication between the opposed sides,
wherein the plurality of modules includes a transmitter, a receiver, a synthesizer module and an interface/radio processing control ("IF/RPC") module disposed between the synthesizer module and both the transmitter and the receiver.

2. The wireless communication system as recited in claim 1 wherein said operating frequency band is in a range of 6 to 38 GHz.

3. The wireless communication system as recited in claim 1 wherein the plurality of modules further includes a diplexer, with the diplexer being coupled to receive signals from both the transmitter and the receiver and direct the signals into the aperture, referred to as directed signals.

4. The wireless communication system as recited in claim 3 wherein each of said plurality of radios includes an antenna coupled to receive the directed signals.

5. The wireless communication system of claim 4, wherein the antenna is a flat antenna.

6. The wireless communication system of claim 4, wherein the antenna is a parabolic antenna.

7. The wireless communication system as recited in claim 4 further comprising a mounting plate for mounting thereto and dissipating heat produced by at least one of the modules.

8. The wireless communication system as recited in claim 1 wherein each of the plurality of radios includes an antenna with the transmitter and the receiver being disposed between the antenna and the synthesizer module.

9. The wireless communication system as recited in claim 1 wherein each of the plurality of radios further includes an antenna in juxtaposition with both the transmitter and the receiver to receive the directed signals.

10. A wireless communication system, comprising:
a plurality of radios each configured to communicate at an operating frequency band and including a housing, a radio equipment assembly, disposed within the housing and having a transmitter and a receiver, a synthesizer module, and an interface/radio processing control ("IF/RPC") module, said IF/RPC module having opposed sides with an aperture extending between the opposed sides, the IF/RPC module placing the synthesizer module in signal communication with both the transmitter and receiver, with the transmitter and receiver being disposed on one of the opposed sides and the synthesizer module being mounted to the remaining opposed sides, the radio equipment assembly having dimensions and the transmitter, the receiver, the synthesizer module and IF/RPC module each having a size and a shape, the dimensions, the size and the shape being substantially independent of the operating frequency band, wherein the IF/RPC module is disposed between the synthesizer module and both the transmitter and the receiver.

11. The wireless communication system as recited in claim 10 wherein each of the plurality of radios further includes a mounting plate having opposed surfaces, with the synthesizer module being mounted to one of the opposed surface and the transmitter, the receiver and the IF/RPC module being mounted to the remaining surface of the opposed surfaces.

12. A wireless communication system operating at a predetermined frequency, the system comprising:
a radio equipment assembly including a transmitter, a receiver, an interface/radio processing control ("IF/RPC") module and a synthesizer module, the IF/RPC module placing the synthesizer in signal communication with both the transmitter and the receiver and having opposed sides with an aperture extending between the opposed sides, with the synthesizer module being mounted to one of the opposed sides and the transmitter and the receiver being mounted to the other side of the opposed sides, the synthesizer having a throughway in superimposition with the aperture; and
a diplexer coupled to receive signals from both the transmitter and the receiver and direct the signals referred to as directed signals into the throughway to propagate through the aperture,
wherein the IF/RPC module is disposed between the synthesizer module and both the transmitter and the receiver.

13. The system as recited in claim 12 further including a mounting plate having opposed surfaces with a passageway extending therebetween, the passageway being in superimposition with both the aperture and the throughway and disposed therebetween.

14. The system as recited in claim 12 further including a mounting plate having opposed surfaces with a passageway extending therebetween, the passageway being in superimposition with both the aperture and the throughway and disposed therebetween, with the synthesizer module being mounted to one of the opposed surfaces and the IF/RPC module being mounted to the remaining surface of the opposed surfaces.

15. The system as recited in claim 12 further including a mounting plate having opposed surfaces with a passageway extending therebetween. the passageway being in superimposition with both the aperture and the throughway and disposed therebetween, with the synthesizer module being mounted to one of the opposed surfaces and the IF/RPC module being mounted to the remaining surface of the opposed surfaces, the transmitter and the receiver being mounted to the IF/RPC.

16. The system as recited in claim 12 further including an antenna coupled to receive the directed signals.

17. The system as recited in claim 16 wherein the antenna is a flat antenna.

18. The system as recited in claim 16 wherein the antenna is a parabolic antenna.

19. The system as recited in claim 16 wherein the antenna is in juxtaposition with both the transmitter and the receiver to receive the directed signals.

20. The system as recited in claim 16 further including a housing surrounding the radio equipment assembly and the diplexer with the antenna being disposed adjacent to and spaced-apart from both the transmitter and the receiver with a portion of the housing being disposed between the antenna and both the transmitter and the receiver.

21. The system as recited in claim 12 wherein the transmitter and the receiver operate over a range of wavelengths, with the wavelengths being selected from a set of wavelengths consisting essentially of a microwave wavelength and a millimeter wavelength.

* * * * *